(12) United States Patent
Bartley et al.

(10) Patent No.: US 9,568,940 B2
(45) Date of Patent: Feb. 14, 2017

(54) MULTIPLE ACTIVE VERTICALLY ALIGNED CORES FOR THREE-DIMENSIONAL CHIP STACK

(71) Applicant: International Business Machines Corporation, Armonk, NY (US)

(72) Inventors: Gerald K. Bartley, Rochester, MN (US); Darryl J. Becker, Rochester, MN (US); William P. Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 486 days.

(21) Appl. No.: 14/097,647

(22) Filed: Dec. 5, 2013

(65) Prior Publication Data

US 2015/0162311 A1    Jun. 11, 2015

(51) Int. Cl.
*G06F 13/00* (2006.01)
*G06F 1/04* (2006.01)
(Continued)

(52) U.S. Cl.
CPC ............ *G06F 1/04* (2013.01); *H01L 22/20* (2013.01); *H01L 25/0657* (2013.01); *G06F 13/4086* (2013.01); *H01L 22/14* (2013.01); *H01L 24/05* (2013.01); *H01L 24/06* (2013.01); *H01L 24/13* (2013.01); *H01L 24/16* (2013.01); *H01L 2224/0401* (2013.01); *H01L 2224/0557* (2013.01); *H01L 2224/06181* (2013.01);
(Continued)

(58) Field of Classification Search
None
See application file for complete search history.

(56) References Cited

U.S. PATENT DOCUMENTS 7,379,316 B2    5/2008  Rajan
7,592,697 B2    9/2009  Arana et al.
(Continued)

FOREIGN PATENT DOCUMENTS

EP        0515577 B1    2/1992

OTHER PUBLICATIONS

Bartley, G., et al., "Donor Cores to Improve Integrated Circuit Yield," U.S. Appl. No. 13/948,805, filed Jul. 23, 2013.
(Continued)

*Primary Examiner* — Henry Tsai
*Assistant Examiner* — Aurangzeb Hassan
(74) *Attorney, Agent, or Firm* — Wood, Herron & Evans, LLP; Robert R. Williams

(57) ABSTRACT

An integrated circuit (IC) stack device for multiple active vertically stacked cores is disclosed. The IC stack device can include a primary IC having a first set of cores, and a supplementary IC interfaced with the primary IC having a second set of cores. The IC stack device can also include a peripheral component connection located such that the primary IC is between the peripheral component connection and the supplemental IC. The IC stack device can include control logic configured to route, in a primary mode, signals from a particular core of the first set of cores to a data bus. The control logic can route, in a secondary mode, signals from a particular core of the second set of cores to a data bus. The control logic can route, in a dual mode, signals from both of the particular cores to a data bus.

9 Claims, 10 Drawing Sheets

(51) Int. Cl.
*H01L 25/065* (2006.01)
*H01L 21/66* (2006.01)
*G06F 13/40* (2006.01)
*H01L 23/00* (2006.01)

(52) U.S. Cl.
CPC .............. *H01L 2224/131* (2013.01); *H01L 2224/16145* (2013.01); *H01L 2225/06513* (2013.01); *H01L 2225/06541* (2013.01); *H01L 2225/06589* (2013.01); *H01L 2924/37001* (2013.01)

(56) References Cited

U.S. PATENT DOCUMENTS

| | | |
|---|---|---|
| 8,395,191 B2 | 3/2013 | Or-Bach et al. |
| 2009/0144669 A1 | 6/2009 | Bose et al. |
| 2009/0224388 A1 | 9/2009 | Bernstein et al. |
| 2009/0291533 A1 | 11/2009 | Ebbers et al. |
| 2010/0015732 A1 | 1/2010 | Bose et al. |
| 2010/0078790 A1 | 4/2010 | Ito et al. |
| 2010/0296238 A1 | 11/2010 | Mowry et al. |
| 2012/0007229 A1 | 1/2012 | Bartley et al. |
| 2014/0108778 A1* | 4/2014 | Molloy ............ G06F 9/223 713/100 |
| 2014/0317389 A1* | 10/2014 | Wenisch ............ G06F 1/20 712/229 |
| 2015/0162250 A1 | 6/2015 | Bartley et al. |
| 2015/0162259 A1 | 6/2015 | Bartley et al. |

OTHER PUBLICATIONS

Bartley, G., et al., "Intelligent Chip Placement within a Three-Dimensional Chip Stack," U.S. Appl. No. 14/097,585, filed Dec. 5, 2013.

* cited by examiner

MULTIPLE ACTIVE VERTICALLY ALIGNED CORES FOR THREE-DIMENSIONAL CHIP STACK

This disclosure relates generally to semiconductor integrated circuit manufacturing, and more specifically to thermal management of a 3D integrated circuit stack.

BACKGROUND

Integrated circuits created by semiconductor manufacturing processes often contain defects, some of which may impact the function of the integrated circuit. Some defects may render parts of the integrated circuit unusable. Semiconductor manufacturers seek to improve the yield of manufacturing processes by bypassing defective portions of integrated circuits.

SUMMARY

Aspects of the present disclosure are directed toward an integrated circuit stack device, and methods of using, that address challenges including those discussed herein, and that are applicable to a variety of applications. These and other aspects of the present invention are exemplified in a number of implementations and applications, some of which are shown in the figures and characterized in the claims section that follows.

Aspects of the present disclosure, in certain embodiments, are directed toward an integrated circuit stack device for multiple active vertically stacked cores. In certain embodiments, the integrated circuit stack device can include a primary integrated circuit having a first set of cores with a ratio of first enabled cores and first disabled cores. The first set of cores can be located on a first side of the primary integrated circuit. The primary integrated circuit can also have a second side opposing the first side. In various embodiments, the integrated circuit stack device can also have a supplementary IC interfaced with the primary integrated circuit. The supplementary integrated circuit can have a second set of cores with a second ratio of second enabled cores and second disabled cores, with the second ratio being less than the first ratio. The second set of cores can be located on a third side of the supplementary integrated circuit. The supplementary integrated circuit can also have a fourth side opposing the third side. Consistent with various embodiments, the integrated circuit stack device can also include a peripheral component connection located such that the primary integrated circuit is between the peripheral component connection and the supplementary integrated circuit. The peripheral component connection can electrically connect the IC stack device to one or more devices external to the IC stack device. Consistent with various embodiments, the integrated circuit stack device can also include control logic configured to support three operative modes. The control logic can, in a primary mode, route signals from a particular enabled core of the first enabled cores to a data bus located within the IC stack device. In a secondary mode, the control logic can route signals from a particular enabled core of the second enabled cores to a data bus located within the IC stack device. In certain embodiments, the control logic can, in a dual mode, route signals from both of the particular enabled cores to a data bus located within the IC stack device.

Aspects of the present disclosure, in certain embodiments, are directed toward a method for operating an integrated circuit (IC) stack device. In certain embodiments, the method can include enabling, on a first side of a primary IC, a set of first enabled cores. The method can also include disabling, on the first side of the primary IC, a set of first disabled cores. In certain embodiments, the method can include enabling, on a first side of a secondary IC, a set of second enabled cores. The method can also include disabling, on the first side of the secondary IC, a set of second disabled cores having more cores than the set of first disabled cores. Consistent with various embodiments, the method can include adding a peripheral component connection to a location on the IC stack device such that the supplementary IC is between the peripheral component connection and the primary IC. The peripheral component connection can electrically connect the IC stack device to one or more devices external to the IC stack device. In certain embodiments, the method can include selecting a mode for control logic configured to support three operative modes. The control logic can, in a primary mode, route signals from a particular enabled core of the first enabled cores to a data bus located within the IC stack device. In a secondary mode, the control logic can route signals from a particular enabled core of the second enabled cores to a data bus located within the IC stack device. In certain embodiments, the control logic can, in a dual mode, route signals from both of the particular enabled cores to a data bus located within the IC stack device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments of the invention and do not limit the disclosure.

Figure 1:
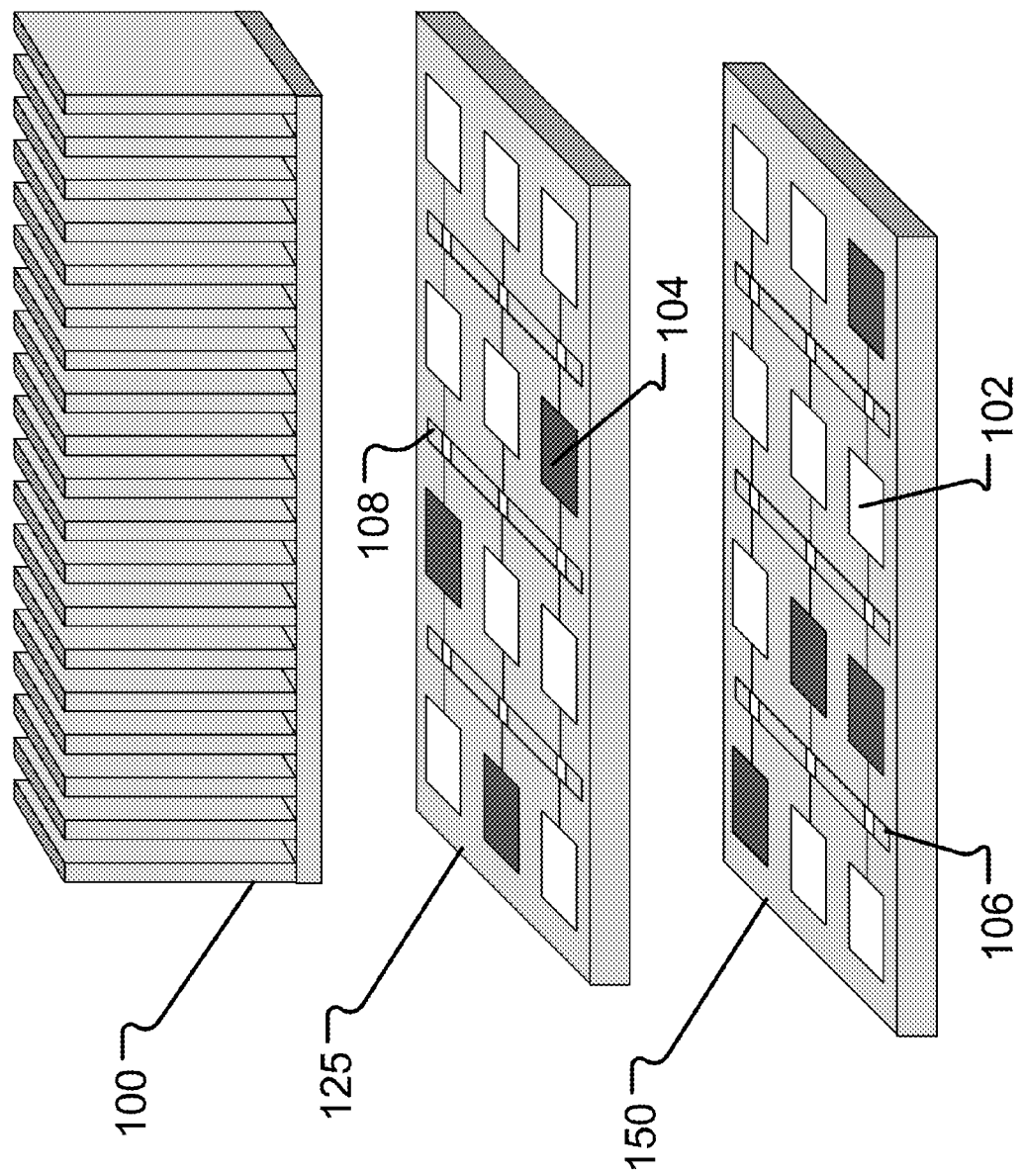
FIG. 1 shows a three-dimensional exploded view of a primary integrated circuit, supplementary integrated circuit, and cooling element, consistent with embodiments of the present disclosure

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to various embodiments and methods for improving yields of functional integrated circuits, more particular aspects relate to a 3D integrated circuit stack device designed for thermal management. While the present invention is not necessarily limited to such applications, various aspects of the invention may be appreciated through a discussion of various examples using this context.

Aspects of the present disclosure relate to a 3D integrated circuit stack device designed for thermal management, with a primary IC, a supplementary IC, and a cooling element. In certain embodiments, the primary IC has at least one non-functional core. Consistent with various embodiments, the primary IC can be interfaced with the supplementary IC and the cooling element, such that the supplementary IC can provide functionality from a functional core to replace that of the non-functional core on the primary IC, and the cooling element can facilitate heat dissipation of the IC stack device. In certain embodiments, the primary IC can be placed higher in the stack, closer to the cooling element.

In certain instances, the primary IC's greater distance from the power source may lead to transmitted power losses due to increased resistance and inductance. Aspects of the present disclosure relate to the recognition that such power losses are acceptable with regard to the thermal management benefits facilitated by a configuration in which the primary IC is placed higher in the IC stack. Accordingly, such a configuration can provide acceptable power capabilities with good thermal management efficiency.

Additionally, aspects of the present disclosure relate to a 3D integrated circuit stack device that can support simultaneously active vertically aligned cores. Consistent with various embodiments, such a configuration can include a primary IC, a supplementary IC, and a cooling element, wherein the primary IC has a functional core vertically aligned with a functional core on the supplemental IC. In such a configuration, both cores could be used simultaneously, which may provide benefits associated with improved performance and functionality. Aspects of the present disclosure relate to the recognition that, in such a configuration, it may be desirable to operate one or both of the active cores at a lower performance level based upon factors relating to the thermal management and power characteristics of the chip stack device.

Consistent with embodiments of the present disclosure, the stacking of primary and supplementary ICs can be useful for improving production efficiency. Production efficiency is pertinent to the success of manufacturing processes because it strongly influences the profitability and cost of producing manufactured goods. As a manufacturing process becomes more efficient, the manufacturer is generally able to produce goods in less time or at a lower cost than before the efficiency gains occurred.

In semiconductor manufacturing, yield can refer to the fraction of functional chips or integrated circuits produced by a manufacturing process. The product of a semiconductor manufacturing process may be referred to as either a chip, a die, or an integrated circuit. A chip or die can be a part of a silicon wafer that undergoes a manufacturing process to build an integrated circuit on the surface of the wafer. A wafer can be divided into pieces by a process called dicing.

An integrated circuit is a circuit where the parts of the circuit are physically connected with each other and electrically connected. Integrated circuits built on silicon wafers can include, as part of the circuit, areas of the wafer surface that have been modified to have specific electrical properties. Other parts of the circuit can be built atop this treated wafer surface as layers of materials are added to the wafer surface. Because these added-on components of the circuit (contacts, trenches, vias, conducting materials, insulating materials, liners, etc. . . . ) are part of (or integrated within) the wafer surface, the term integrated circuit can also refer to the chip or die that contains the integrated circuit.

Integrated circuits can be designed with one or more functional blocks, also referred to herein as cores. Each core can be physically located in a respective region of an integrated circuit, and can perform an intended function in the greater integrated circuit. A core can contain a circuit block that actually performs the intended function as well as circuitry that communicates data into and out of the circuit block. A core may also contain additional circuit elements that optionally disable the circuit block. Many modern integrated circuits contain multiple cores of different types, including such types as central processing units (CPUs or processors), microprocessors, graphical processing units (GPUs), memory management units (MMUs), memory controllers, input/output controllers, optical sensors, and other specialty digital and analog circuit components.

As semiconductor technology has advanced, the structural features of integrated circuits have become extremely small. Semiconductor gate structures with lateral measurements smaller than 30 nanometers can be produced in certain manufacturing facilities, and film thicknesses as small as a few Angstroms are possible. While these small dimensions may not be found throughout the semiconductor device, scaling certain parts of integrated circuits can be useful for achieving small die sizes that will fit more chips on a wafer.

The structure and chemical composition of a circuit's structural elements dictate the circuit's function. If either the structure or chemical composition is sufficiently disrupted, the integrated circuit may not function as intended and the circuit may need to be discarded or repaired. The small size of individual structural elements in an integrated circuit makes them very fragile and susceptible to damage that may disrupt the integrated circuit's function. Such damage may be localized or widespread, potentially rendering a circuit block, a core, or an entire integrated circuit nonfunctional. The level of functionality acceptable for a core or a functional block can vary depending on the application and purpose of the integrated circuit. For example, an integrated circuit intended for use as part of a memory management system may have a different acceptable functionality threshold for cores than an integrated circuit intended for use as part of a graphical processing unit. Cores that are found to be below the functionality threshold desired for a particular application can be considered non-functional.

Integrated circuit defects may occur via chemical contamination, processing errors, electrostatic discharge, or the introduction of particles into the circuit so as to disrupt the electrical characteristics of properly formed circuit structural elements or to disrupt the physical structure of the circuit itself, interfering with the circuit's proper electrical function. For example, chemical contamination may disrupt the electrical performance of a gate structure creating a short in the circuit. Alternatively, when the chemical composition of photo-resist is altered, the resist may not develop or dissolve properly, causing disruption or destruction of the intended pattern on the silicon wafer. Electrostatic discharge during film deposition or etching can melt deposited metal, break insulating barriers, and scatter particles across the wafer surface that bridge conductive areas or block conductive lines. Processing errors may result in incomplete etching, leaving, for example, material at the bottom of via structures that blocks the intended conductive path through an insulating dielectric layer. Also, particulate contamination can block etches, fill and break conductive lines, and knock over delicate gate structures.

These and other types of defects can be reduced by identifying and eliminating the sources of individual defects in order to increase total chip yield. For instance, sources of particulate contamination can be identified and eliminated. Wafer processing steps can also be frequently adjusted to address chemical contamination or processing errors. The sources of the largest particulate contaminants can be the easiest to eliminate and the first ones selected for removal because large particles affect larger areas of the integrated circuit. Identifying and eliminating the sources of smaller, more widespread particles can be a more difficult exercise than for large particles, but may nevertheless be undertaken if the smaller particles cause sufficient harm to the final integrated circuits. Chemical contamination and electrostatic discharge damage may be identified by special analytical methods before the manufacturing process can be changed. In some circumstances, in situ defect reduction may not be a cost effective way to completely eliminate yield problems, requiring additional steps to improve yield.

One method of overcoming persistent defects in integrated circuits is to design redundancy into the overall integrated circuit by placing additional cores in the chip. When a manufacturing process is complete, the manufacturer can test the chips for function and partition them according to their defect rate or performance. Fully functional chips, or at least sufficiently functional chips, can be sold or distributed without further treatment, while chips that have defective cores can be subject to an in situ repair process, where defective cores are disabled or bypassed and functional redundant cores are enabled to provide the intended number of cores in the final integrated circuit product. Alternatively, a sufficient number of defective and functional cores may be disabled, providing a lesser number of cores that will still allow for operation of the integrated circuit at a lower performance level than originally planned for the circuit. The use of redundant cores to overcome core-damaging defects can add additional costs, whether in terms of physical space on the chip or manufacturing costs. For instance, designs with redundant cores can use additional wafer surface area per chip and decrease the number of chips that fit on a single wafer. With fewer chips available per wafer, a manufacturer may end up having to produce more wafers to achieve a target number of functional chips.

An alternative method of overcoming core-damaging defects is to perform an ex situ repair process on defective chips by stacking two same-type chips on top of each other and electrically connecting parts of the two integrated circuits together. Consistent with embodiments of the present disclosure, defective chips from a single manufacturing process can be used to repair each other by identifying and isolating good cores in a supplemental chip, deactivating bad cores in a primary chip, and linking the supplemental chip's good cores into the primary chip integrated circuit. When ex situ repair is successful, the repaired primary chip can perform its intended function and increases overall manufacturing yield. Ex situ stacked chip repair can allow manufacturers to repair integrated circuits without the need for redundant cores, thereby reducing the size of each IC and making it possible to fit more chips on a wafer.

Aspects of the present disclosure are directed toward challenges related to 3D chip stacks, such as providing sufficient thermal management. As computing requirements increase, so too do the processing speeds and clock frequencies of integrated circuits, which can result in an increase in power consumption. Similarly, this increase in power consumption can lead to greater heat output. It can be desirable for integrated circuits to be maintained within a specified temperature range in order to avoid overheating, instability, and component damage, which can lead to a shortened integrated circuit lifespan. Facilitating adequate cooling for multiple circuit layers can be more challenging than for a single integrated circuit, as the heat generated by each integrated circuit accumulates, resulting in a higher temperature gradient for the chip stack. Moreover, as the stack size increases, the distance between the active components and a heat dissipation point can increase, leading to a reduced cooling efficiency.

Vertically oriented chip stacks can include a primary IC and a supplementary IC, the primary IC having a higher number of functional cores than the supplementary IC, and the supplementary IC interfaced with the primary IC to provide replacement cores for those that have been disabled on the primary IC. Additionally, a cooling element can also be included in the chip stack to facilitate heat dissipation. As the primary IC can have greater power requirements than the supplementary IC due to its greater number of functioning cores, its placement lower in the chip stack results in the primary IC being located proximate to the power source. This can be useful for reducing transmission losses (e.g., due to increased resistance or inductance).

Although aspects of the present disclosure are discussed in terms of 3D IC stack devices with two integrated circuits, IC stack devices with three or more integrated circuits are also possible. In such configurations, the primary IC could remain on top of the IC stack to maintain close proximity with the cooling unit, in accordance with the embodiments described herein.

Embodiments of the present disclosure relate to the recognition that from a thermal management perspective, lower placement of the primary IC can result in a significant heat generator—the primary IC—being located farther from the cooling element. For instance, placing the primary IC lower in the IC stack can lead to the generation of excess heat and result in higher temperature gradients for the IC stack, leading to impaired processing efficiency, decreased stability, and shortened component life spans. Accordingly, aspects of the present disclosure relate to a stacking configuration which can be particularly useful for mitigating excess heat, and improving the overall efficiency, stability, and lifespan of the IC stack components.

Aspects of the present disclosure relate to a 3D integrated circuit stack device designed for thermal management and heat distribution. For instance, embodiments of the present disclosure are directed toward a 3D integrated circuit stack in which a primary IC having one or more non-functional cores can be interfaced with a cooling element and with a supplementary IC to provide replacement cores, such that the primary IC can be located between the supplementary IC and the cooling element. Consistent with various embodiments, the primary IC and the supplementary IC can both be full-size die. In certain embodiments, the primary IC and the supplementary IC can be arranged in a front-to-front stacking configuration. In certain embodiments, the primary IC and the supplementary IC can be arranged in a front-to-back stacking configuration. In certain embodiments, the primary IC and the supplementary IC can be arranged in a back-to-back stacking configuration.

Consistent with various embodiments, the primary IC can have a first set of cores, including enabled cores and disabled cores, located on a surface of the primary IC. Similarly, the supplementary IC can have a second set of cores, including enabled cores and disabled cores, located on a surface of the supplementary IC. The first set of cores and the second set of cores can include a variety of types of circuit components, such as central processing units (CPUs), graphical processing units (GPUs), memory management units (MMUs), memory controllers, input/output controllers, optical sensors, and other specialty digital and analog circuit components.

Consistent with various embodiments, the cooling element can be an active or passive component capable of facilitating heat dissipation of the IC stack. For example, in certain embodiments, the cooling element can include one or more passive cooling components such as a heat sink. In certain embodiments, the cooling element can include one or more active cooling components such as a fan or liquid cooling delivery system or device.

Consistent with various embodiments, the primary IC and the supplementary IC can be equipped with on-chip communication networks, enabling a variety of connections to other components such as other chips in the IC stack, devices external to the IC stack, and power supplies. Further, the primary IC and the secondary IC can each include a data bus that allows for communication between cores located on a respective integrated circuit. Once integrated circuits have been designated as primary ICs and supplementary ICs in the manufacturing process, the IC stack device can be connected and configured such that the data bus on the primary IC functions as an active data bus for all cores on both the primary IC and the supplementary IC. For example, in certain embodiments, the data bus on the primary IC can be utilized to facilitate the routing of information between the cores on one chip in the IC stack and cores on other chips in the IC stack.

In various embodiments, the communication networks of the primary IC and the supplementary IC can include on-chip logical elements to replace the functionality of disabled cores on the primary IC with enabled cores from the supplementary IC. In certain embodiments, the logical elements can include a multiplexer block configured to route communication between a core on an IC and one or more data buses that can be connected to other cores, thereby allowing communication between cores. In certain embodiments, the multiplexer block can be configured to selectively route signals between the data bus on the primary IC and cores on either the primary IC or the supplementary IC. The signal selection can be based upon the functional state of the cores. For instance, in certain embodiments, an enabled core on the supplementary IC can send communication signals through the multiplexer block on the primary IC, which can route these signals to the data bus in place of the signal from a disabled core on the primary IC. Control signals for the multiplexer blocks (e.g., signals to control the activation or deactivation of cores) can be sent from the respective IC on which the multiplexer block is located.

In certain embodiments, the primary IC and the supplementary IC can be arranged in a variety of configurations. Integrated circuits have two surfaces that are pertinent to describing certain configurations mentioned in the present disclosure: an active device surface on which the components critical to the IC's function are located, and a die substrate surface opposing the active device surface. Consistent with various embodiments, the primary IC and the supplementary IC can be arranged such that the active device surface (front) of the primary IC can be interfaced with the front of the supplementary IC. In certain embodiments, the primary IC and the supplementary IC can be arranged such that the front of the primary IC can be interfaced with the die substrate surface (back) of the supplementary IC. Further, in certain embodiments, the primary IC and the supplementary IC can be arranged such that the back of the primary IC can be interfaced with the front of the supplementary IC. In certain embodiments, the primary IC and the supplementary IC can be arranged such that the back of the primary IC can be interfaced with the back of the supplementary IC. Accordingly, the orientation of the primary IC and the supplementary IC can be varied to meet the needs of a variety of applications.

In various embodiments, the orientation of the primary IC and the supplementary IC may result in cores of the supplementary IC being located at a greater distance from the primary data bus. For instance, consistent with various embodiments, the primary IC and the supplementary IC may be oriented in a front-to-back stacking configuration, in which case the die substrate layer of one of the chips may separate the primary data bus from the cores of the supplementary IC. Accordingly, aspects of the present disclosure are directed toward a 3D IC stack device that includes one or more through-silicon vias (TSVs) that enable power delivery and communication between the primary IC and the supplementary IC in a variety of stacking configurations. For instance, in certain embodiments, the signal from one or more functional cores on the supplementary IC can be carried by a TSV connection to the multiplexer block on the primary IC. Such configurations can be particularly useful when the primary IC and the supplementary IC are oriented in a front-to-back or back-to-back stacking configuration.

In certain embodiments, power is supplied to the IC stack device via a power source located below the cooling element, primary IC, and supplementary IC in the IC stack. In certain embodiments, power can be delivered to the IC stack by one or more TSVs. For example, in certain embodiments, a TSV can carry power from a power source through or from the supplementary IC to the primary IC.

Consistent with various embodiments, during the IC fabrication process, silicon wafers and individual die (e.g. die that have passed through the dicing operation) can undergo a back-grinding process to reduce the thickness of the die substrate layer. Such a process can facilitate power delivery to chips in an IC stack, as well as having positive effects on the IC stack's thermal balance. For instance, back grinding techniques can decrease the distance between a power source and the active device layer of a chip in an IC stack, reducing inductance and resistance while mitigating associated losses in transmitted power. Further, the use of back grinding techniques to reduce the thickness of the die substrate layer can decrease the distance between a chip in an IC stack and a cooling element, facilitating heat dissipation of the IC stack.

Turning now to the figures, FIG. 1 shows a three-dimensional exploded view of the primary integrated circuit 125, supplementary integrated circuit 150, and cooling element 100, consistent with embodiments of the present disclosure. Aspects of FIG. 1 are directed toward a 3D integrated circuit stack device designed for thermal management, and including a primary IC 125 that can be located between a supplementary IC 150 and a cooling element 100. The primary IC 125 can be interfaced with the supplementary IC 150 and the cooling element 100 such that the cooling element can facilitate heat dissipation of the IC stack device. Consistent with various embodiments, the primary IC 125 can include a first set of cores including one or more functional cores (depicted without shading) and one or more non-functional cores (depicted as shaded), such as non-functional core 104, located on a surface of the primary IC 125. Similarly, the supplementary IC 150 can include a second set of cores including one or more functional cores, such as functional core 102, and one or more non-functional cores, located on a surface of the supplementary IC 150. In certain embodiments, functional cores can be disabled to facilitate thermal and power management of the IC chip stack.

Consistent with various embodiments, the primary IC 125 and the supplementary IC 150 can each include a data bus configured to route information between cores located on a respective integrated circuit. In certain embodiments, once an IC has been designated as a primary IC 125 in the manufacturing process, the IC stack device can be connected and configured such that the data bus 108 on the primary IC 125 can function as an active data bus for all cores on both the primary IC 125 and the supplementary IC 150. In certain embodiments, the data bus 106 on the supplementary IC can be capable of facilitating communication between the cores on the supplementary IC. In certain embodiments, the data bus 106 can be inactive.

Figure 2:
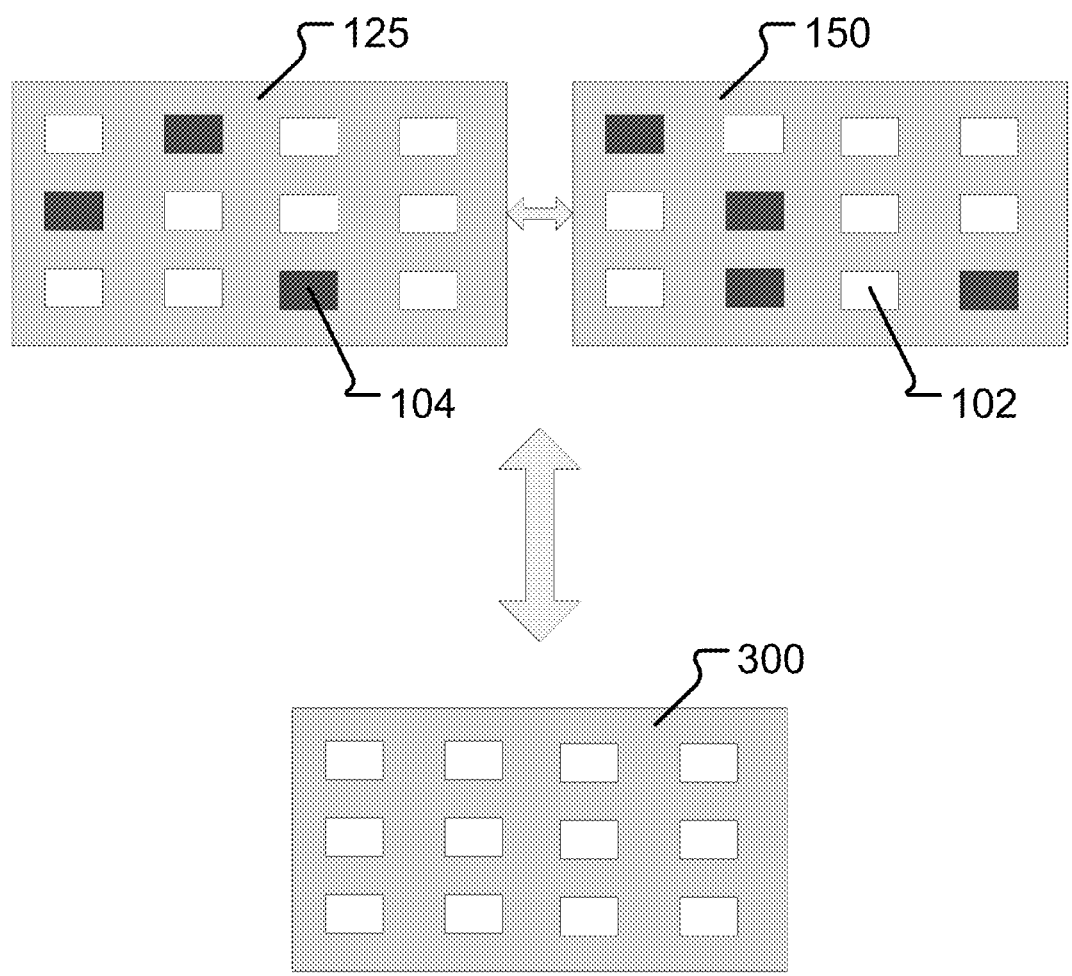
FIG. 2 shows a logical or functional representation of an IC stack device in which the functionality of disabled cores on the primary integrated circuit can be replaced by the functionality of enabled cores on the supplementary integrated circuit, consistent with embodiments of the present disclosure.

FIG. 2 shows a logical or functional representation of the system in which the functionality of non-functional cores (depicted as shaded) on the primary integrated circuit 125 can be replaced by the functionality of functional cores (depicted without shading) on the supplementary integrated circuit 150. Aspects of FIG. 2 are directed toward systems and methods designed to increase the yield of functional integrated circuits. Consistent with various embodiments, FIG. 2 shows a logical or functional representation of both a primary IC 125 and a supplementary IC 150, which can each include a number of functional cores, such as functional core 102 and non-functional cores, such as non-functional core 104. As discussed herein, in certain embodiments, the primary IC 125 can have more functional cores than the supplementary IC 150.

In certain embodiments, the 3D IC stack device can be designed to allow the functionality of functional cores on the supplementary IC 150 to be utilized in place of non-functional cores on the primary IC 125, thereby replacing the functionality of the non-functional core (which may be disabled). For example, consistent with various embodiments, the functionality of the functional core 102 can be utilized in place of the functionality of the non-functional core 104. By replacing the functionality of non-functional cores on the primary IC 125 with the functionality of functional cores on the supplementary IC, the IC stack device can make use of a greater number of cores than either the primary IC 125 or the supplementary IC 150 individually, as depicted by the resultant IC logical or functional representation 300.

Consistent with various embodiments, the primary IC 125 and the supplementary IC 150 can be matched such that the supplementary IC 150 has functional cores in locations that correspond to the locations of the non-functional cores on the primary IC 150. This configuration can be particularly useful for facilitating communication between the primary IC and the supplementary IC. Further, in certain embodiments, there can be a 1:1 ratio between the non-functional cores on the primary IC and the functional cores on the supplementary IC 150.

In certain embodiments, the supplementary IC 150 can have a greater number of functional cores than the number of non-functional cores on the primary IC 125. In such a configuration, the extra functional cores on the supplementary IC 150 can be treated as "spare cores," and can be utilized to supplement the primary IC 125, or for redundancy, e.g., as a replacement in case of core failure on the primary IC 125. In certain embodiments, these "spare cores" can be disabled (e.g. physically disabled with a fuse, or logically disabled, such as through the use of an EPROM logic switch) until they are desired as a replacement core, at which point they can be re-activated. Further, in certain embodiments, these spare cores can be activated in order to balance the thermal distribution of the active cores within the IC stack without adversely impacting performance. For example, consistent with various embodiments, a functional core on the primary IC 125 can be temporarily disabled, and a spare core on the supplementary IC 150 can be utilized instead, shifting the heat generation to elsewhere in the IC stack, and having positive effects on the overall thermal distribution of the IC stack device.

Aspects of the present disclosure relate to the recognition that, in certain embodiments, the supplementary IC 150 can have a lesser number of functional cores than the number of non-functional cores on the primary IC 125. In certain embodiments, certain cores within primary IC 125 may have been designed with functionality similar to or redundant with another core in the IC stack, such that one of them is sufficient. Further, consistent with various embodiments, one or more cores on the supplementary IC 150 can be specifically designed to have functionality redundant with a non-functional core on the primary IC 125, and thus act as a replacement. In certain embodiments, the application of the IC circuit stack may allow for a lesser number of total functional cores, such that some number of non-functional cores can be considered acceptable. For example, in certain embodiments, the resultant IC representation 300 can have 10 functional cores. In certain embodiments, the resultant IC representation 300 can have 7 functional cores. Other core configurations are also possible. Such configurations can have positive effects on manufacturing productivity, and allow for the creation of lower cost products.

Figure 3:
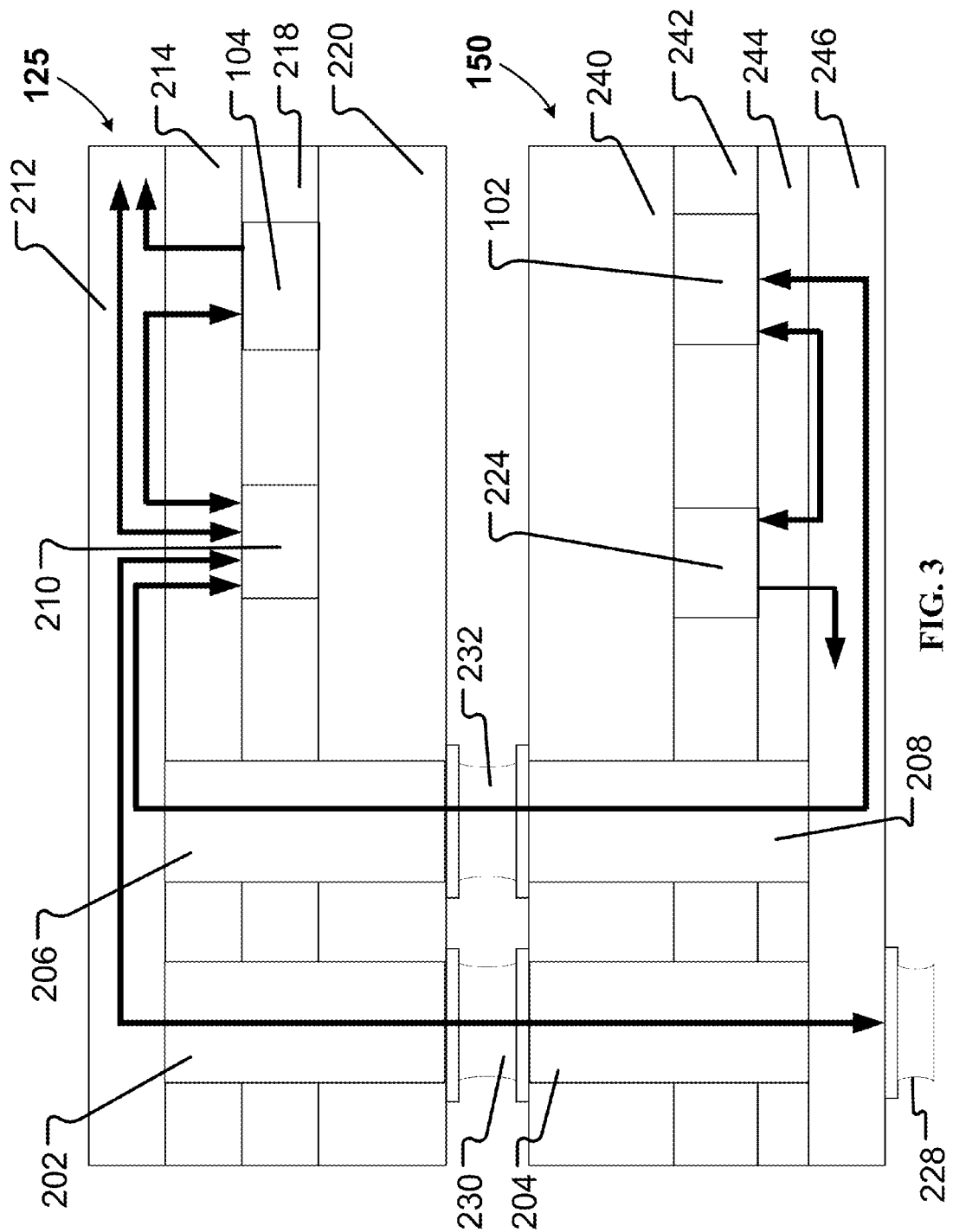
FIG. 3 shows a cross-sectional view of a primary IC and a supplementary IC in a back-to-back orientation, consistent with embodiments of the present disclosure.

FIG. 3 shows a cross-sectional view of the primary IC 125 and the supplementary IC 150 in a back-to-back orientation. Consistent with certain embodiments, functional core 102 can be enabled, and non-functional core 104 can be disabled. For ease of discussion with reference to FIGS. 3-5, these cores can be referred to as enabled core 102 and disabled core 104, respectively. Aspects of FIG. 3 are directed toward a 3D IC stack device with an on-chip communication network and logic system configured to replace the functionality of a disabled core 104 on a primary IC 125 with the functionality of an enabled core 102 from a supplementary IC 150. In certain embodiments, the primary IC 125 and the supplementary IC 150 can be arranged in a back-to-back configuration, in which the die substrate surfaces of each IC are interfaced with one another.

Consistent with various embodiments, the primary IC 125 and the supplementary IC 150 can be arranged in a back-to-back configuration, in which the die substrate surfaces of each IC are interfaced with one another. Further, in certain embodiments, the primary IC 125 and the supplementary IC 150 can have identical active device layer layouts (i.e. active devices of the same size and type located in the same respective location of each IC). Aspects of the present disclosure relate to the recognition that, in such a configuration (i.e., back-to-back and with identical active device layer layouts), the primary IC 125 and the supplementary IC 150 are inverted with respect to one another. This can cause misalignment between active devices (e.g. cores, input/output rings, communication contacts, power pins) on the primary IC 125 with corresponding active devices on the supplementary IC 150. Accordingly, to facilitate alignment between the active devices on the primary IC 125 with corresponding active devices on the supplementary IC 150, aspects of the present disclosure relate to designing a primary IC 125 and a supplementary IC 150 with symmetry relative to one another about the horizontal or vertical axis of the active device surface. Such a symmetry condition can allow the active devices on the primary IC 125 to align properly with corresponding active devices on the supplementary IC 150 in a back-to-back configuration.

In certain embodiments, the primary IC 125 and the supplementary IC 150 can be composed of a plurality of layers, including but not necessarily limited to one or more of the following: a die substrate layer 220, 240, a front-end-of-line (FEOL) layer 218, 242, a (critical logic) back-end-of-line (BEOL) layer 214, 244, a partition/global BEOL layer 212, and a custom BEOL layer 246. In certain embodiments, after being designated as a supplementary IC in the manufacturing process, the supplementary IC 150 can be equipped with a custom BEOL layer 246 designed to facilitate connectivity between the supplementary IC 150 and the primary IC 125. Consistent with various embodiments, the die substrate layer 220, 240, FEOL layer 218, 242, (critical logic) BEOL layer 214, 244, partition/global BEOL layer 212, and custom BEOL layer 246 can each be made up of one or more sub-layers of semiconductor materials, interconnection devices, or other structures.

Aspects of the present disclosure relate to a 3D IC stack device with a primary IC 125 and a supplementary IC 150 arranged in a back-to-back orientation. In such a configuration, with the die substrate surface 220 of the primary IC 125 interfaced with the die substrate surface 240 of the supplementary IC 150, the partition/global BEOL layer 212 of the primary IC 125 can be directly interfaced with a cooling element, facilitating heat dissipation of the active devices on the primary IC 125. As these active devices can be a significant source of heat generation in the IC chip stack, such a back-to-back configuration can have positive effects on the thermal management of the IC chip stack.

Aspects of the present disclosure are directed toward a 3D integrated circuit stack device including one or more multiplexer blocks configured to selectively route data between cores in the IC stack and a variety of peripheral components, such as an input/output ring or a data pin. Other peripheral components are also possible. In certain embodiments, both the primary IC 125 and the supplementary IC 150 include a multiplexer block. In certain embodiments, the multiplexer block 224 on the supplementary IC 150 can be unused, and the multiplexer block 210 on the primary IC can function as the active multiplexer block for the IC stack device. For instance, in certain embodiments, the multiplexer block 210 can be communicatively connected with an enabled core 102 on the supplementary IC and a disabled core 104 on the primary IC. The multiplexer block 210 can then selectively route data from the enabled core 102 to a data bus in place of data from the disabled core 104.

Consistent with various embodiments, the primary IC 125 and the supplementary IC 150 can include one or more TSV connections to allow for communication between the supplementary IC 150 and the primary IC 125. In certain embodiments, the primary IC 125 can include a TSV 202 and a TSV 206, and the supplementary IC 150 can include a TSV 204 and a TSV 208. The TSV 202 and the TSV 206 can be connected to the TSV 204 and the TSV 208, respectively, by means of a first chip interconnect 230 and a second chip interconnect 232. The chip interconnects can follow one or more of a variety of chip interconnect designs, including but not necessarily limited to a solder bump, a pogo pin, or a fuzzy bump. In certain embodiments, the multiplexer block 210 can be connected to the enabled core 102 through the TSV 206, the second chip interconnect 232, and the TSV 208. In certain embodiments, the multiplexer block 210 can connect to a peripheral component connection 228 (e.g., an input/output ring or a data pin) through the TSV 202, the first chip interconnect 230, and the TSV 204.

Figure 4:
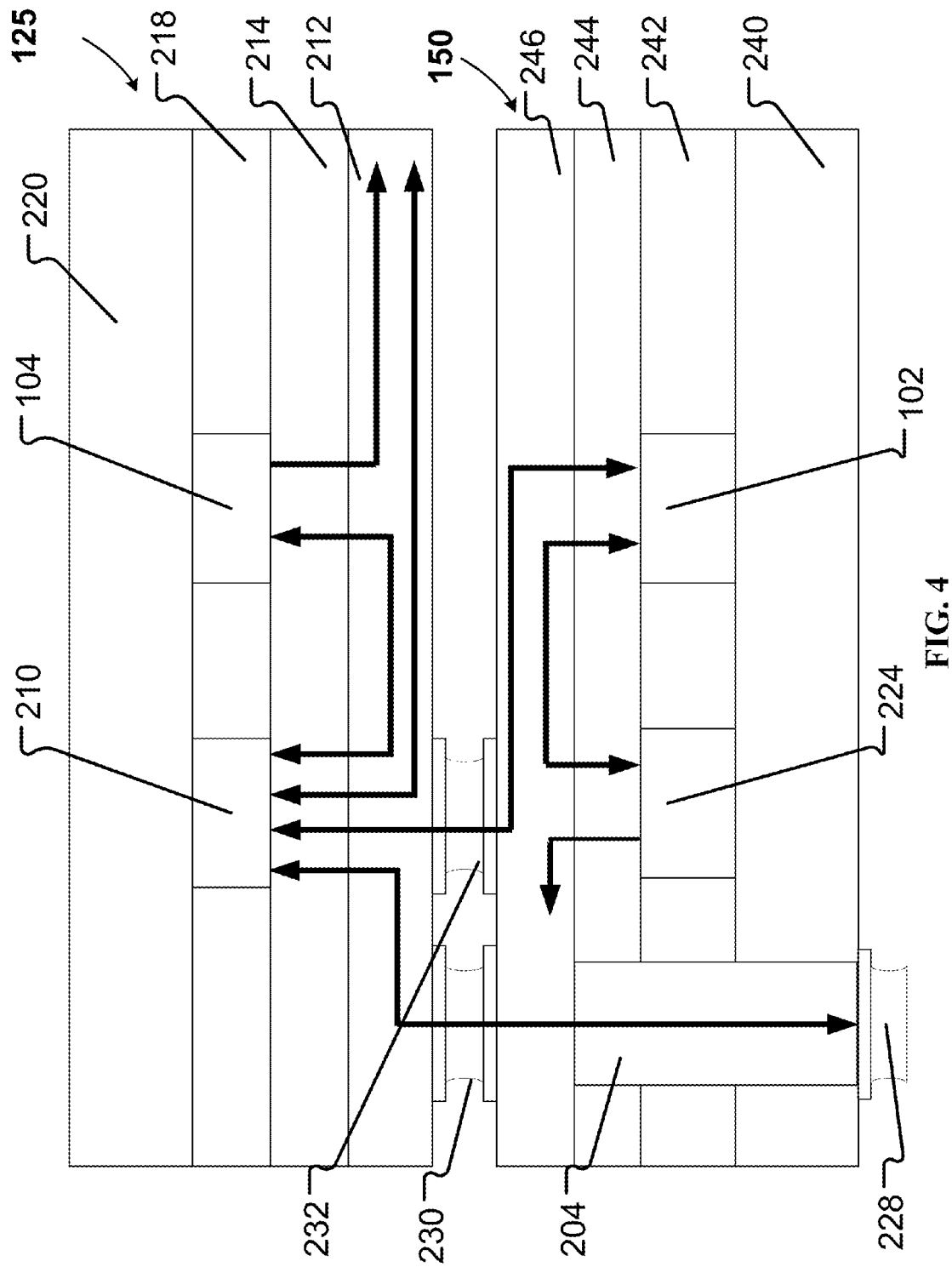
FIG. 4 shows a cross-sectional view of a primary IC and the supplementary IC in a front-to-front orientation, consistent with embodiments of the present disclosure.

FIG. 4 shows a cross-sectional view of the primary IC 125 and the supplementary IC 150 in a front-to-front orientation. Aspects of FIG. 4 are directed toward a 3D IC stack device with an on-chip communication network and logic system configured to replace the functionality of a disabled or non-functional core 104 on a primary IC 125 with the functionality of an enabled core 102 from a supplementary IC 150. In certain embodiments, the primary IC 125 and the supplementary IC 150 can be arranged in a front-to-front configuration, in which the active device surfaces of each IC are interfaced with one another.

Consistent with various embodiments, the primary IC 125 and the supplementary IC 150 can be arranged in a front-to-front configuration, in which the die substrate surfaces of each IC are interfaced with one another. Further, in certain embodiments, the primary IC 125 and the supplementary IC 150 can have identical active device layer layouts (i.e. active devices of the same size and type located in the same respective location of each IC). Aspects of the present disclosure relate to the recognition that, in such a configuration (i.e., front-to-front and with identical active device layer layouts), the primary IC 125 and the supplementary IC 150 are inverted with respect to one another. This can cause misalignment between active devices (e.g. cores, input/output rings, communication contacts, power pins) on the primary IC 125 with corresponding active devices on the supplementary IC 150. Accordingly, to facilitate alignment between the active devices on the primary IC 125 with corresponding active devices on the supplementary IC 150, aspects of the present disclosure relate to designing a primary IC 125 and a supplementary IC 150 with symmetry relative to one another about the horizontal or vertical axis of the active device surface. Such a symmetry condition can allow the active devices on the primary IC 125 to align properly with corresponding active devices on the supplementary IC 150 in a front-to-front configuration.

In certain embodiments, the primary IC 125 and the supplementary IC 150 can be composed of a plurality of layers, including but not necessarily limited to one or more of the following: a die substrate layer 220, 240, a front-end-of-line (FEOL) layer 218, 242, a (critical logic) back-endof-line (BEOL) layer 214, 244, a partition/global BEOL layer 212, and a custom BEOL layer 246. In certain embodiments, after being designated as a supplementary IC in the manufacturing process, the supplementary IC 150 can be equipped with a custom BEOL layer 246 designed to facilitate connectivity between the supplementary IC 150 and the primary IC 125. Consistent with various embodiments, the die substrate layer 220, 240, FEOL layer 218, 242, (critical logic) BEOL layer 214, 244, partition/global BEOL layer 212, and custom BEOL layer 246 can each be made up of one or more sub-layers of semiconductor materials, interconnection devices, or other structures.

Aspects of the present disclosure relate to a 3D IC stack device with a primary IC 125 and a supplementary IC 150 arranged in a front-to-front orientation. In such a configuration, with the partition/global BEOL layer 212 of the primary IC 125 interfaced with the custom BEOL layer of the supplementary IC 150, few (if any) TSVs are needed to connect the primary IC 125 and the supplementary IC 150, reducing the overall complexity and number of components of the IC stack device. As the front-to-front orientation allows for proximate connection between the active device layer of the primary IC 125 and the supplementary IC 150, such a configuration can be particularly useful for facilitating communication between the integrated circuits in the IC stack. For instance, high speed data signals may be subject to restrictions on signal path length, capacitive loading and other parameters that can be mitigated with shorter signal connection paths.

Aspects of the present disclosure are directed toward a 3D integrated circuit stack device including one or more multiplexer blocks configured to selectively route data between cores in the IC stack and a variety of peripheral devices, such as an input/output ring, a power source, or a data pin. Other peripheral devices are also possible. In certain embodiments, both the primary IC 125 and the supplementary IC 150 can include a multiplexer block. In certain embodiments, the multiplexer block 224 on the supplementary IC 150 can be unused, and the multiplexer block 210 on the primary IC can function as the active multiplexer block for the IC stack device. For instance, in certain embodiments, the multiplexer block 210 can be communicatively connected with an enabled core 102 on the supplementary IC and a disabled core 104 on the primary IC 125, and selectively route data from the enabled core 102 to a data bus in place of data from the disabled core 104.

Consistent with various embodiments, the supplementary IC 150 can have one or more TSV connections that allow for communication between one or more ICs in the chip stack and devices external to the chip stack, as well as between the supplementary IC 150 and the primary IC 125. For example, in certain embodiments, the supplementary IC 150 can include a TSV 204 that provides an electrical connection between the multiplexer block 210 and a peripheral device connection 228. The TSV 204 can be electrically connected to the primary IC 125 through the use of a chip interconnection 230. In certain embodiments, the multiplexer block 210 on the primary IC can be connected to the enabled core 102 through the chip interconnection 232. The chip interconnects can follow one or more of a variety of chip interconnect designs, including but not necessarily limited to a solder bump, a pogo pin, or a fuzzy bump. In certain embodiments, the multiplexor block 210 can be communicatively connected with an input/output ring on the primary IC 125 or the supplementary IC 150 that can facilitate connection to devices external to the IC stack through a TSV connection.

Figure 5:
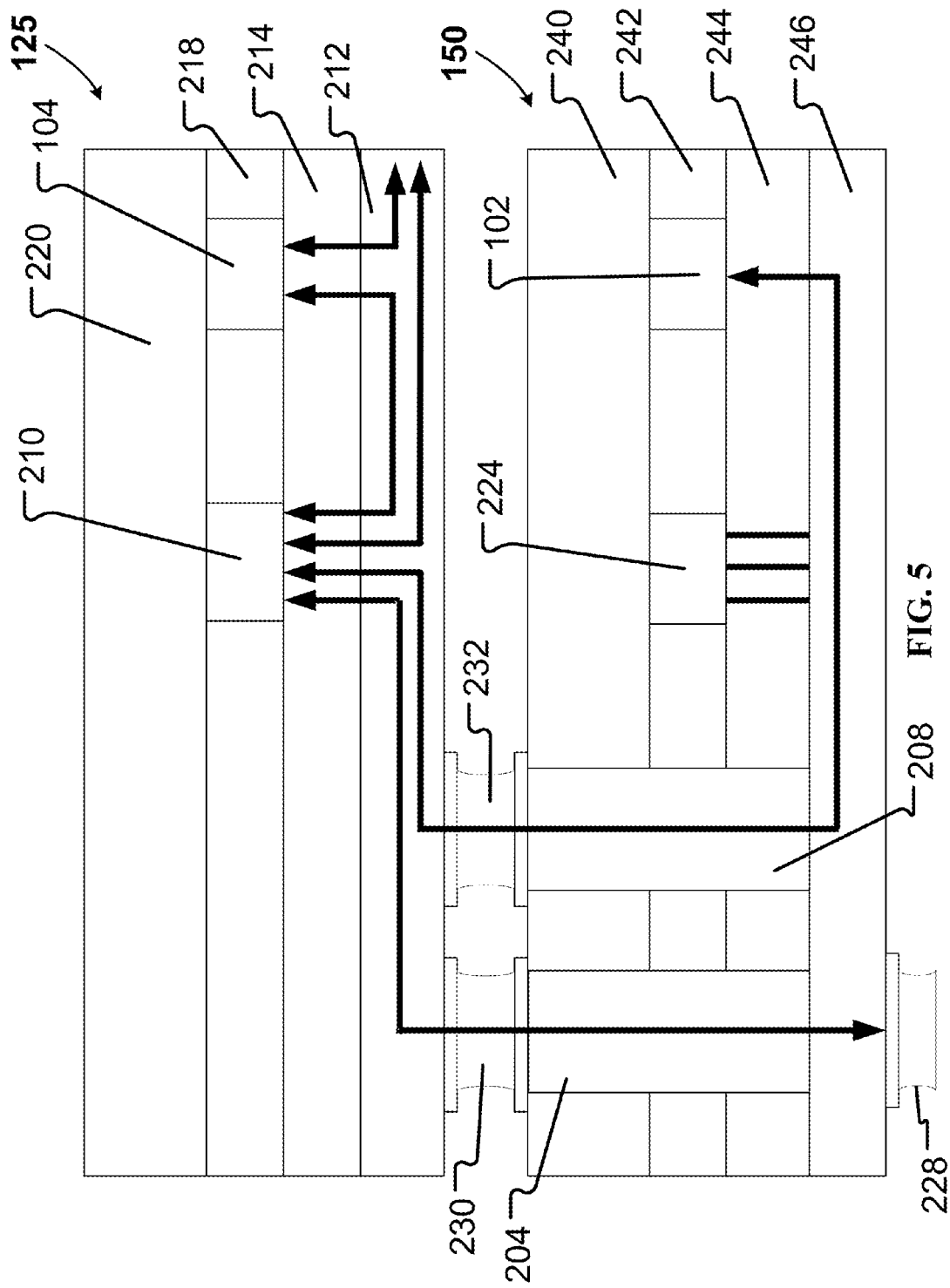
FIG. 5 shows a cross-sectional view of the primary IC 125 and a supplementary IC in a front-to-back orientation, consistent with embodiments of the present disclosure.

FIG. 5 shows a cross-sectional view of the primary IC 125 and the supplementary IC 150 in a front-to-back orientation. Aspects of FIG. 5 are directed toward a 3D IC stack device with an on-chip communication network and logic system configured to replace the functionality of a disabled or non-functional core 104 on a primary IC 125 with the functionality of an enabled core 102 on a supplementary IC 150. In certain embodiments, the primary IC 125 and the supplementary IC 150 can be arranged in a front-to-back configuration, in which the active device surface of the primary IC 125 is interfaced with the die substrate surface of the supplementary IC 150.

In certain embodiments, the primary IC 125 and the supplementary IC 150 can be composed of a plurality of layers, including but not necessarily limited to one or more of the following: a die substrate layer 220, 240, a front-end-of-line (FEOL) layer 218, 242, a (critical logic) back-end-of-line (BEOL) layer 214, 244, a partition/global BEOL layer 212, and a custom BEOL layer 246. In certain embodiments, after being designated as a supplementary IC in the manufacturing process, the supplementary IC 150 can be equipped with a custom BEOL layer 246 designed to facilitate connectivity between the supplementary IC 150 and the primary IC 125. Consistent with various embodiments, the die substrate layer 220, 240, FEOL layer 218, 242, (critical logic) BEOL layer 214, 244, partition/global BEOL layer 212, and custom BEOL layer 246 can each be made up of one or more sub-layers of semiconductor materials, interconnection devices, or other structures.

Aspects of the present disclosure relate to a 3D IC stack device with a primary IC 125 and a supplementary IC 150 arranged in a front-to-back orientation. In such a configuration, with the partition/global BEOL layer 212 of the primary IC 125 interfaced with the die substrate surface of the supplementary IC 150, power from a power source below the supplementary IC 150 can be delivered to the active device layer of the primary IC 125 without passing through the die substrate layer 220 of the primary IC 125. Such a configuration can be particularly useful for facilitating power delivery to the primary IC 125, and can reduce inductance and resistance while mitigating associated losses in transmitted power.

Aspects of the present disclosure are directed toward a 3D integrated circuit stack device including one or more multiplexer blocks configured to selectively route data between cores in the IC stack and a variety of peripheral devices, such as an input/output ring, a power source, or a data bus. Other peripheral devices are also possible. In certain embodiments, both the primary IC 125 and the supplementary IC 150 can include a multiplexer block. In certain embodiments, the multiplexer block 224 on the supplementary IC 150 can be unused, and the multiplexer block 210 on the primary IC can function as the active multiplexer block for the IC stack device. For instance, in certain embodiments, the multiplexer block 210 can be communicatively connected with an enabled core 102 on the supplementary IC and a disabled core 104 on the primary IC 125, and selectively route data from the enabled core 102 to a data bus in place of data from the disabled core 104. In certain embodiments, the multiplexor block 210 can be communicatively connected to an input/output ring or other communication elements through a TSV connection.

Consistent with various embodiments, the supplementary IC 150 can include one or more TSV connections to allow for communication between the supplementary IC 150 and the primary IC 125. In certain embodiments, the supplementary IC 150 can include a TSV 204 and a TSV 208. The TSV 204 and the TSV 208 can be connected to the primary IC 125 through the use of a first chip interconnect 230 and a second chip interconnect 232, respectively. In certain embodiments, the multiplexer block 210 can be connected to the enabled core 102 through the second chip interconnect 232 and the TSV 208. In certain embodiments, the multiplexer block 210 can connect to a peripheral component connection 228 (e.g., an input/output ring or a data pin) through the first chip interconnect 230 and the TSV 204.

Figure 6:
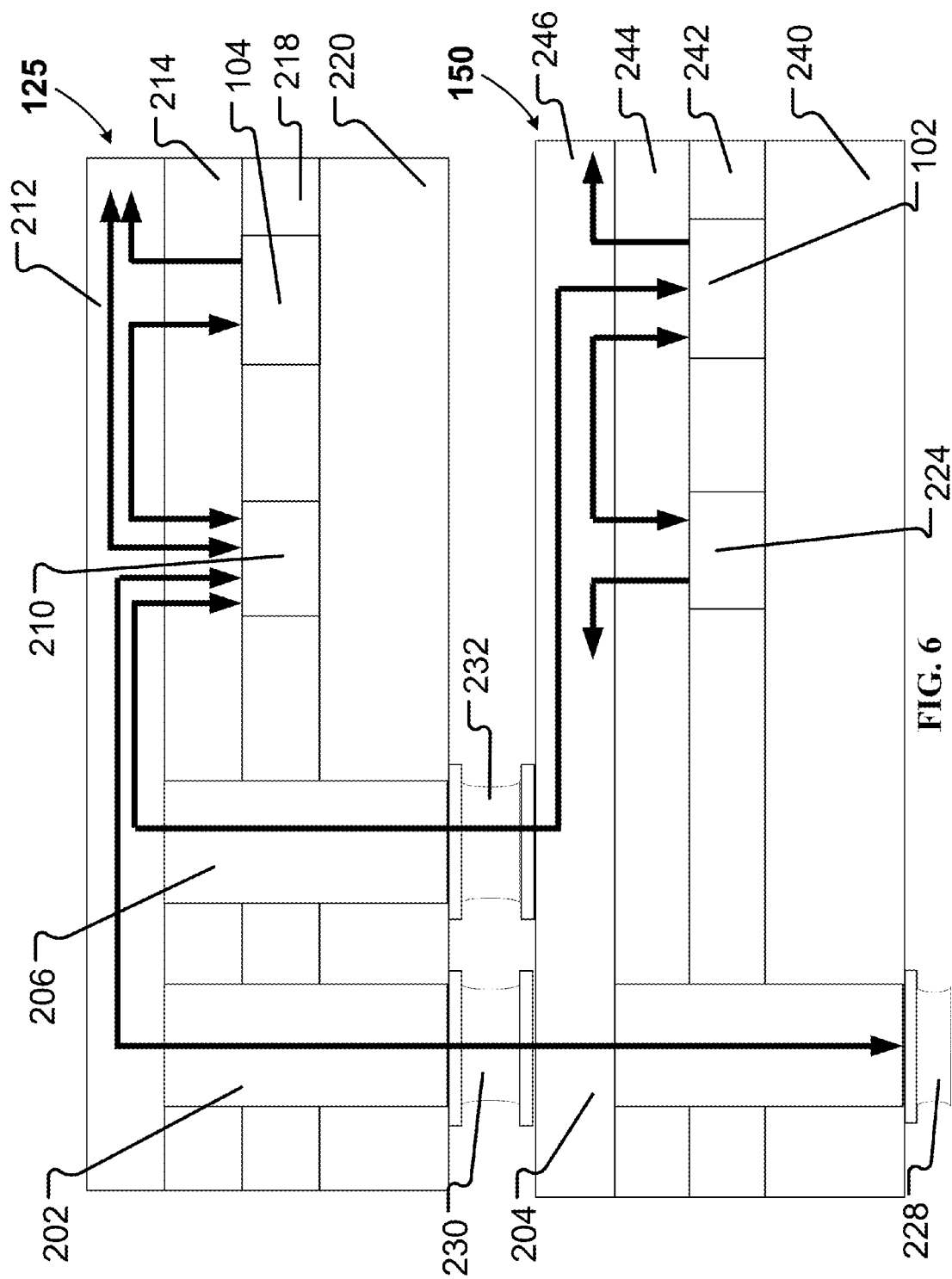
FIG. 6 shows a cross-sectional view of a primary IC and a supplementary IC in a back-to-front orientation, consistent with embodiments of the present disclosure.

FIG. 6 shows a cross-sectional view of the primary IC 125 and the supplementary IC 150 in a back-to-front orientation. Aspects of FIG. 6 are directed toward a 3D IC stack device with an on-chip communication network and logic system configured to replace the functionality of a disabled or non-functional core 104 on a primary IC 125 with the functionality of an enabled core 102 from a supplementary IC 150. In certain embodiments, the primary IC 125 and the supplementary IC 150 can be arranged in a back-to-front configuration, in which the die substrate surface of the primary IC 125 is interfaced with the active device surface of the supplementary IC 150.

In certain embodiments, the primary IC 125 and the supplementary IC 150 can be composed of a plurality of layers, including but not necessarily limited to one or more of the following: a die substrate layer 220, 240, a front-end-of-line (FEOL) layer 218, 242, a (critical logic) back-end-of-line (BEOL) layer 214, 244, a partition/global BEOL layer 212, and a custom BEOL layer 246. In certain embodiments, after being designated as a supplementary IC in the manufacturing process, the supplementary IC 150 can be equipped with a custom BEOL layer 246 designed to facilitate connectivity between the supplementary IC 150 and the primary IC 125. Consistent with various embodiments, the die substrate layer 220, 240, FEOL layer 218, 242, (critical logic) BEOL layer 214, 244, partition/global BEOL layer 212, and custom BEOL layer 246 can each be made up of one or more sub-layers of semiconductor materials, interconnection devices, or other structures.

Aspects of the present disclosure relate to a 3D IC stack device with a primary IC 125 and a supplementary IC 150 arranged in a back-to-front orientation. In such a configuration, the partition/global BEOL layer 212 of the primary IC 125 can be directly interfaced with the cooling element. As the active devices (e.g. cores) located proximate to the partition/global BEOL layer 212 of the primary IC 125 are a significant source of heat for the IC stack device, placement next to the cooling element can facilitate heat dissipation and thermal management of the IC stack device. Further, as the active devices located on the custom BEOL layer 246 of the supplementary IC 150 can also generate heat, such a configuration with the custom BEOL layer 246 oriented facing the cooling element can have further positive effects on the overall thermal distribution of the IC stack device.

Aspects of the present disclosure are directed toward a 3D integrated circuit stack device including one or more multiplexer blocks configured to selectively route data between cores in the IC stack and a variety of peripheral devices, such as an input/output ring, a power source, or a data pin. Other peripheral devices are also possible. In certain embodiments, both the primary IC 125 and the supplementary IC 150 can include a multiplexer block. In certain embodiments, the multiplexer block 224 on the supplementary IC 150 can be unused, and the multiplexer block 210 on the primary IC can function as the active multiplexer block for the IC stack device. For instance, in certain embodiments, the multiplexer block 210 can be communicatively connected with an enabled core 102 on the supplementary IC and a disabled core 104 on the primary IC 125, and selectively route data from the enabled core 102 to a data bus in place of data from the disabled core 104.

Consistent with various embodiments, the primary IC 125 and the supplementary IC 150 can include one or more TSV connections to allow for communication between the supplementary IC 150 and the primary IC 125. In certain embodiments, the primary IC 125 can include a TSV 202 and a TSV 206, and the supplementary IC 150 can include a TSV 204. The TSV 202 can be connected to the TSV 204 by means of a first chip interconnect 230. Similarly, the TSV 206 can be connected to the supplementary IC 150 by means of a second chip interconnect 232. In certain embodiments, the multiplexer block 210 can be connected to the enabled core 102 through the TSV 206 and the second chip interconnect 232. In certain embodiments, the multiplexer block 210 can be connected to a peripheral component connection 228 (e.g., an input/output ring) through the TSV 202, the first chip interconnect 230, and the TSV 204. The multiplexer block 210 can also be communicatively connected with a data bus located on the primary IC 125.

Figure 7:
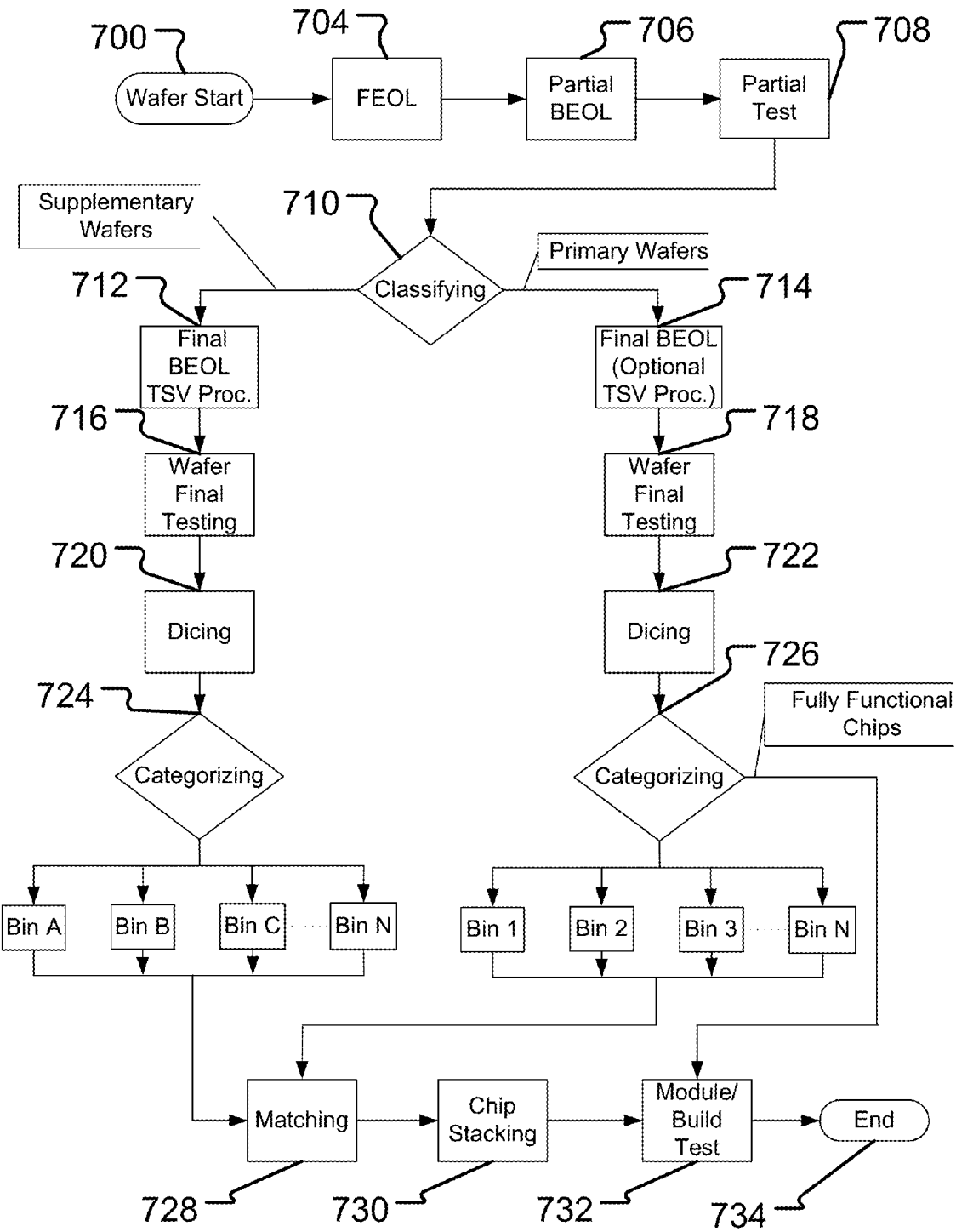
FIG. 7 shows a block diagram of the process of assembling a 3D integrated circuit stack device, consistent with embodiments of the present disclosure.

FIG. 7 shows a block diagram of the process of assembling a 3D integrated circuit stack device, consistent with embodiments of the present disclosure. Consistent with various embodiments, the process can begin with the preparation of silicon wafers at block 700. Wafer preparation can include the cutting and polishing of a slice from a monocrystalline ingot, as well as the process of pre-cleaning the wafer with high purity, low particle chemicals. In certain embodiments, the silicon wafers can be heated and exposed to ultra-pure oxygen to form a uniform-film silicon dioxide film on the surface of the wafer. At certain stages throughout the process described herein, the silicon wafers can undergo photolithography, or "masking." In certain embodiments, a photo-resist or light-sensitive film can be applied to the wafer, and the wafer can be aligned to a photomask pattern. The wafer can then be exposed to high intensity light, transferring the geometric pattern from the photomask to the silicon substrate.

The silicon wafer can then pass to block 704, at which point the front-end-of-line (FEOL) devices can be formed. In certain embodiments, the FEOL devices can include transistors, capacitors, resistors and other discrete circuit components. At block 706, some of the back-end-of-line (BEOL) devices can be formed on the silicon wafer. In certain embodiments, the BEOL devices can provide interconnections for the FEOL devices already formed on the silicon wafer. In certain embodiments, the BEOL devices can include resistors, inductors, transmission lines, capacitors, wires, contacts, dielectrics, insulators or bonding sites.

At block 708, the wafers can undergo a partial device test. The semiconductor devices can be subjected to a variety of electrical tests to determine whether or not they are functioning properly. In certain embodiments, the silicon wafers can undergo kerf testing to monitor for factors (e.g. defects in the kerf structures) that indicate likelihood of cores on the wafer being defective or non-functional. For example, in certain embodiments, kerf testing can include testing of DRAM arrays, SRAM arrays, logic structures (e.g. latches and combinational logic) and other kerf structures. The results of the kerf testing can provide information about the health of a given silicon wafer, which can impact its path through the assembly process. In certain embodiments, if the results of the kerf testing indicate that a silicon wafer has a likelihood beyond a certain tolerance level of cores on the wafer being defective, production of the entire wafer can be halted to avoid the costs of further processing.

At block 710, the results of the kerf testing and/or partial device testing of block 708 can be used to classify a silicon wafer as a primary based IC wafer or a supplementary based IC wafer. For example, consistent with various embodiments, wafers that were determined to be substantially healthy by the kerf testing and/or partial device testing process can be classified as primary based IC wafers. In certain embodiments, wafers that were not determined to be substantially healthy can be classified as supplementary based IC wafers.

Based upon their classification as primary based IC wafers or supplementary based IC wafers at block 710, the wafers can then proceed to either block 712 or block 714. If a wafer has been classified as a primary based IC wafer it can proceed to block 714 to receive a final BEOL layer. In certain embodiments, the final BEOL layer can include additional metal interconnection layers. In certain embodiments, if a wafer has been classified as a supplementary based IC wafer, it can proceed to block 712 to receive a custom BEOL layer. The custom BEOL layer can be unique with respect to the final BEOL layer of the primary based IC wafer, and can facilitate connection between the enabled cores on the supplementary IC and the active data bus on the primary IC.

Further, blocks 712 and 714 can allow for the processing of through-silicon-vias in the silicon wafers. In certain embodiments, one or more TSVs can be created to allow for communication between the supplementary IC and a primary IC or other peripheral component after assembly of an IC stack device. In certain embodiments, the supplementary based IC wafers can undergo TSV processing. In certain embodiments, both the supplementary based IC wafers and the primary based IC wafers can undergo TSV processing.

The primary based IC wafers and the supplementary based IC wafers can then pass to blocks 716 and 718, respectively, to undergo a final test to evaluate the functionality of the semiconductor devices. In certain embodiments, the final testing can be customized for the primary based IC wafers and the supplementary based IC wafers due to the relative differences in their BEOL layers. In certain embodiments, the individual cores on a die can be tested to determine whether or not they are functioning properly. The cores on a die that are determined to be non-functional can be identified and disabled. For example, the location of non-functional cores can be marked on the wafer using a drop of die. In certain embodiments, the non-functional cores can be physically disabled with a fuse, or logically disabled, such as through the use of an EPROM logic switch. In certain embodiments, the location of non-functional or disabled cores on a given wafer can be logged to a wafer map stored on a central computer database. This wafer map can then be used subsequently in block 724 and 726 for device categorization and assembly.

The primary based IC wafers and the supplementary based IC wafers can then pass to blocks 720 and 722, respectively, to undergo wafer dicing and be cut into individual silicon die (i.e. primary ICs and supplementary ICs). In certain embodiments, the dicing process can be based upon the number and location of the enabled and disabled cores stored on the wafer map created in blocks 716 and 718.

After undergoing the dicing process, the primary ICs and the supplementary ICs can then pass to blocks 724 and 726, respectively. Here, the individually cut silicon die can be categorized and respectively sorted into one of a plurality of bins. In certain embodiments, primary ICs that have a full set of enabled cores, or "fully functional" die can pass directly to block 732 to undergo module/build testing. In certain embodiments, the binning process of the primary ICs and the supplementary ICs can be based upon the number and location of disabled cores on the primary IC and the supplementary IC. Accordingly, the wafer maps created in blocks 716 and 718 can be referenced and used to sort the primary ICs and the supplementary ICs. For example, in certain embodiments, a supplementary IC could be sorted into one of the bins A, B, C . . . N based upon a wafer map created in block 716, and a primary IC could be sorted into one of the bins 1, 2, 3 . . . N based upon a wafer map created in block 718.

At block 728, each primary IC can be matched with a supplementary IC. In certain embodiments, the matching can be performed by using the wafer maps created in blocks 716 and 718 to pair each primary IC with a supplementary IC such that the location of one or more disabled cores on the primary IC correspond to the location of an enabled core on the supplementary IC. The primary IC and supplementary IC pairs can then proceed to block 730, where they can be assembled into a chip stack. In certain embodiments, the primary IC can undergo a back grinding process to reduce the thickness of the die substrate layer, and facilitate thermal management of the IC stack. For example, in certain embodiments, the supplementary IC and the primary IC can receive back-grinding as part of the TSV creation process. Consistent with various embodiments, the primary IC can be communicatively connected to the supplementary IC, and equipped with an on-chip logic system configured to replace the functionality of disabled or non-functional cores on the primary IC with the functionality of enabled cores from the supplementary IC. The assembled IC stack devices can then proceed to block 732 for final module/build testing to evaluate the functionality of the IC stack device as a whole. If they are determined to be functional, the IC stack devices can then proceed to block 734 for final processing and packaging.

Aspects of the present disclosure relate to a 3D integrated circuit stack device that can support simultaneously active vertically aligned cores. Consistent with various embodiments, such a configuration can include a primary IC, a supplementary IC, and a cooling element, wherein the primary IC has a functional core vertically aligned with a functional core on the supplemental IC. In such a configuration, both cores could be used simultaneously, which may provide benefits associated with improved performance and functionality. Aspects of the present disclosure relate to the recognition that, in such a configuration, it may be desirable to operate one or both of the active cores at a lower performance level based upon factors relating to the thermal management and power characteristics of the chip stack device.

Consistent with various embodiments, a variety of factors may influence the design and construction of a 3D IC stack device for supporting simultaneously active vertically aligned cores. For instance, factors such as heat output, power demands, power leakage, core location, communication bandwidth between cores and the data bus/I/O devices, and the maximum clock frequency of a given core can be considered when deciding to disable particular cores or adjust the clock frequency of certain cores within the IC stack. These factors may be assigned thresholds, or weighted to give priority to one factor over another. For example, in certain embodiments, heat concerns may be given more weight than core speed. In such a configuration, the clock frequency of a certain core may be reduced to stay under a heat threshold. As an additional example, in certain embodiments, it may be desirable to run a certain core at a lower clock frequency if that core is located farther away from the cooling element. Conversely, another core in closer proximity to the cooling element could be adjusted to run at a faster clock frequency. As an additional example, in certain embodiments, an IC located near the cooling element can be associated with a fast process and a high level of power leakage, and its close placement to the cooling element can facilitate running the cores on that device at a higher clock frequency. Conversely, in certain embodiments, an IC located farther from the cooling element can be associated with a slower process and a lower level of power leakage. Accordingly, in a configuration with greater thermal and performance constraints, the cores can be adjusted to run at a lower clock frequency. Accordingly, various embodiments are directed toward ICs designed to facilitate these and other aspects to be configured in a desired manner.

In certain embodiments, during the manufacturing process, ICs could be categorized and binned based on the speed of the cores located on the chip. Further, during IC stack assembly, ICs could then be paired together based on the speed of their cores. Such a configuration may provide benefits associated with increased efficiency and performance of IC stack devices. For example, in certain embodiments, fast ICs could be paired with slow ICs run at a reduced core frequency. Alternatively, two slow ICs could be paired together and run at a reduced core frequency, but still provide the same level of performance as a naturally faster device due to operating in a thermally constrained environment. Such a configuration may also provide benefits associated with increased manufacturing productivity.

Figure 8:
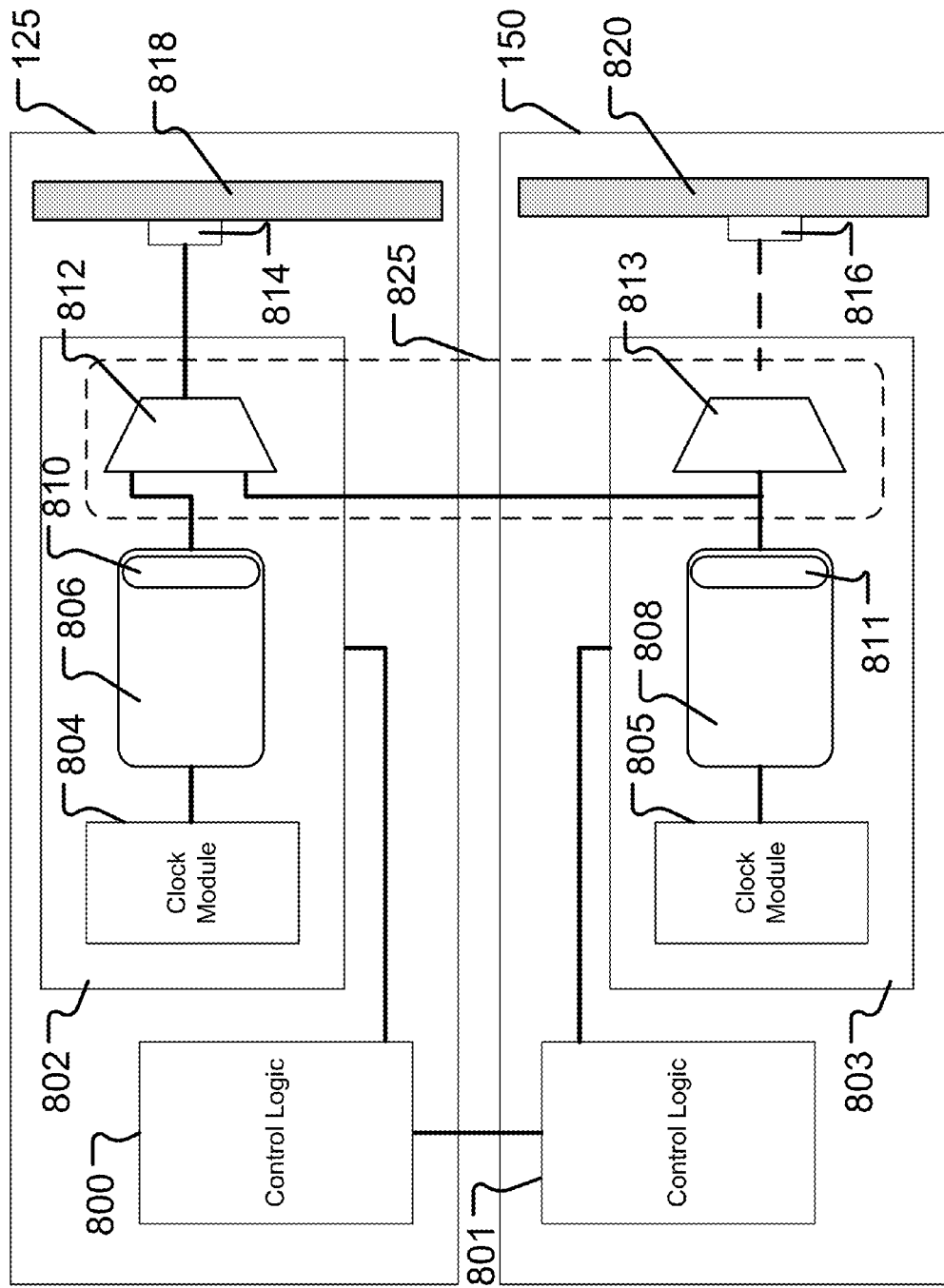
FIG. 8 shows a schematic diagram of a primary IC and a supplementary IC, consistent with embodiments of the present disclosure.

FIG. 8 shows a schematic diagram of a primary IC 125 and a supplementary IC 150, consistent with embodiments of the present disclosure. Aspects of FIG. 8 are directed toward a 3D IC stack device for supporting simultaneously active vertically stacked cores. Consistent with embodiments of the present disclosure, the 3D IC stack device can include a primary IC 125 and a supplementary IC 150. The primary IC 125 and the supplementary IC 150 can include control logic 800, 801 a functional block 802, 803 a multiplexing block 825, a data bus 818, 820 and a data port 814, 816. The functional block 802 can include a clock module 804, 805, a core 806, 808, and a multiplexer 812, 813. In certain embodiments, the data bus 820 and the data port 816 can be inactive.

Consistent with various embodiments, the primary IC 125 and the supplementary IC 150 can include control logic 800, 801. The control logic 800, 801 can be communicatively connected to the functional block 802, 803. In certain embodiments, the control logic 801 can be unused. In certain embodiments, the control logic 800, 801 can be configured in one of a number of operative modes depending upon the application and use of the 3D IC stack device. For example, in certain embodiments, when the core 808 is disabled as discussed herein, the control logic 800 can be configured in a primary mode, in which it can route signals from the core 806 to the data port 814 on the data bus 818. Alternatively, when the core 806 is disabled, the control logic 800 can be configured in a secondary mode in which it can route signals from the core 808 to the data port 814 on the data bus 818. Aspects of the present disclosure relate to configuring the control logic 800 in a dual mode, in which it can route signals from both the core 806 and the core 808 to the data port 814 on the data bus 818. Such a configuration can facilitate simultaneous operation of vertically stacked cores.

Aspects of the present disclosure relate to the recognition that when core 806 and core 808 are simultaneously active, this may result in increased power demands and heat output within the 3D IC stack device. Accordingly, aspects of the present disclosure relate to adjusting the performance level of cores in the IC stack depending on the use and application of the IC stack device. In certain embodiments, the primary IC 125 and the supplementary IC 150 can include clock modules 804 and 805 connected to the cores 806 and 808 respectively that can adjust the clock frequency of the cores 806 and 808. Consistent with various embodiments, the clock frequency of either the core 806 or the core 808 can be adjusted independently to a different clock frequency based on factors including the thermal and power constraints of the system. In certain embodiments, the core 808 can be adjusted to run at a lower clock frequency than the core 806 in order to remain below a thermal threshold or a power threshold. For example, the core 806 could be configured to run at 3.2 Ghz, and the core 808 could be configured to run at 2.8 Ghz. Alternatively, in certain embodiments, both the core 806 and the core 808 could be run at the same reduced clock frequency. For instance, both the core 806 and the core 808 could be run at 3.0 Ghz. Further, in the event that a core failure occurs, the remaining core that was vertically aligned with the failed core could be adjusted to run at a higher clock frequency based on its voltage and temperature conditions.

In certain embodiments, it may be desirable to set all the cores on the primary IC to a certain clock frequency, and all the cores on the supplementary IC to a different clock frequency. Such a configuration may provide benefits associated with simpler arbitration of the data sent from each core. Further, in certain embodiments, both the primary IC and the supplementary IC may be fully functional (i.e., have a full number of functional cores), and the clock frequency of each core on the primary IC and the supplementary IC may be reduced. The voltage provided to each device may also be reduced. Such a configuration could allow the IC stack to maintain a substantially high level of performance while reducing the DC and AC power draw and associated heat output. Other core clock speed configurations can be used to the same or similar effect.

Consistent with various embodiments, the core 806 and the core 808 can include an input/output (I/O) interface 810, 811 which can allow for communication from one clock domain to another. In certain embodiments, the I/O interface 810, 811 can be a synchronous interface configured to transmit data between clock domains that are integer multiples of one another. In certain embodiments, the I/O interface 810, 811 can be an asynchronous interface configured to transmit data between clock domains that are asynchronous with one another.

In certain embodiments, the primary IC 125 and the supplementary IC 150 can include a multiplexing block 825. The multiplexing block 825 can include a multiplexer 812, 813. In certain embodiments, the multiplexer 813 can be unused. Consistent with various embodiments, the multiplexing block 825 can facilitate communication between the core 808 on the supplementary IC 150 and the multiplexer 812 on the primary IC 125. The multiplexing block 825 can allow for communication between the core 808 and the multiplexer 812 on the primary IC 125. In certain embodiments, the multiplexer 812 can route signals from core 806, core 808 or both to a data port 814 on the data bus 818 depending on the mode in which the control logic 800 is configured.

Consistent with various embodiments, the control logic module 800, 801 can provide arbitration for the data sent by the cores 806, 808. For example, in certain embodiments, the arbitration could be a decentralized model, making use of control logic modules 800, 801 to provide arbitration for each core respectively. Alternatively, the arbitration could be a centralized model with a single arbitration module to provide arbitration for both cores 806, 808. In certain embodiments, the arbitration can be based on the clock frequency of the cores. For example, in certain embodiments, cores with a faster clock frequency may be granted more frequent access to the data bus 808.

Figure 9:
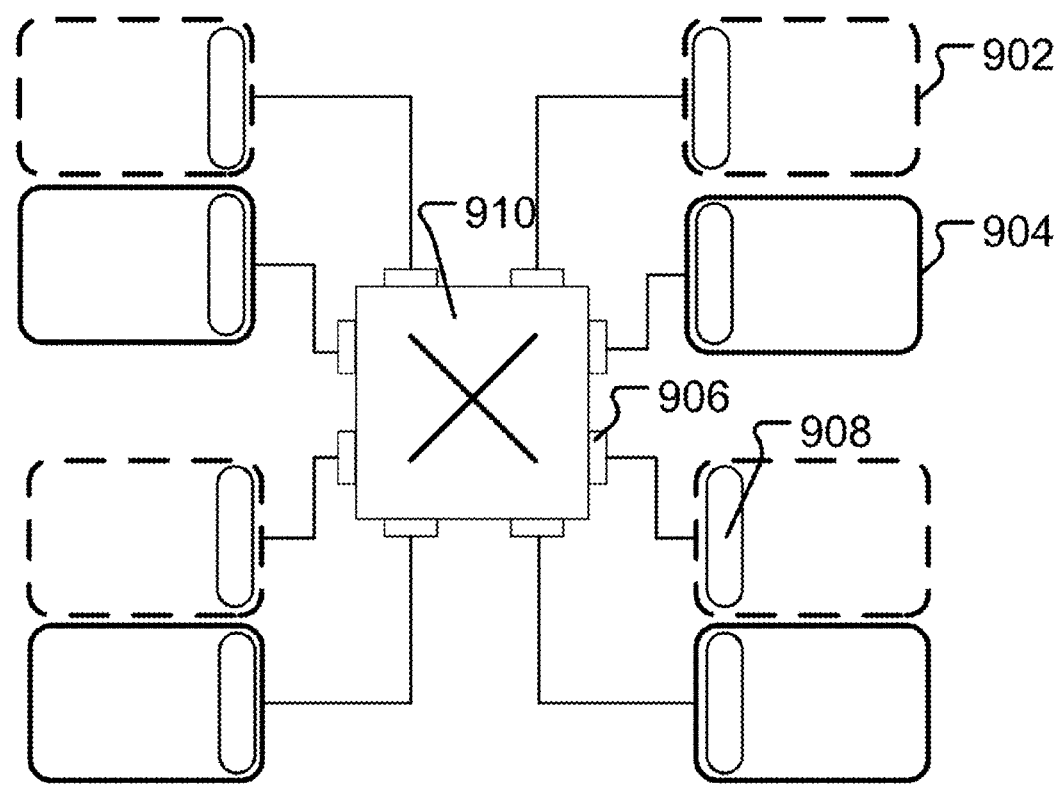
FIG. 9 shows a schematic diagram of an exemplary interconnection network, consistent with embodiments of the present disclosure.

FIG. 9 shows a schematic diagram of a system with an interconnection network, consistent with embodiments of the present disclosure. The system 900 includes an interconnection network 910 for facilitating communication betweens core within a 3D IC stack. Consistent with various embodiments, the interconnection network 910 can be a multi-ported cross bar switch equipped with one or more data ports 906. Each of the data ports 906 can be connected to a supplementary core 902 or a primary core 904. Although eight data ports are depicted in FIG. 9, the number of data ports could scale up or down to match the number of cores within the IC stack device. For example, in certain embodiments, the interconnection network 910 could have 24 data buses to accommodate 24 cores within the IC stack device. Consistent with various embodiments, the supplementary core 902 and the primary core 904 can be simultaneously active, and arranged in a vertically stacked configuration. The supplementary core 902 and the primary core 904 can include an I/O interface 908 that can be configured to transmit data from one clock domain to another. Consistent with various embodiments, the clock crossing interface 908 can be a synchronous interface or an asynchronous interface.

Consistent with various embodiments, the interconnection network 910 can be connected to the supplementary core 902 and the primary core 904 in a bi-directional implementation that supports both read and write functionality. In certain embodiments, the interconnection network 910 can communicate with the supplementary core 902 and the primary core 904 via a single-directional implementation that would separate connections for read and write functionality. Other methods of communication between the interconnection network 910 and the cores are also possible.

Figure 10:
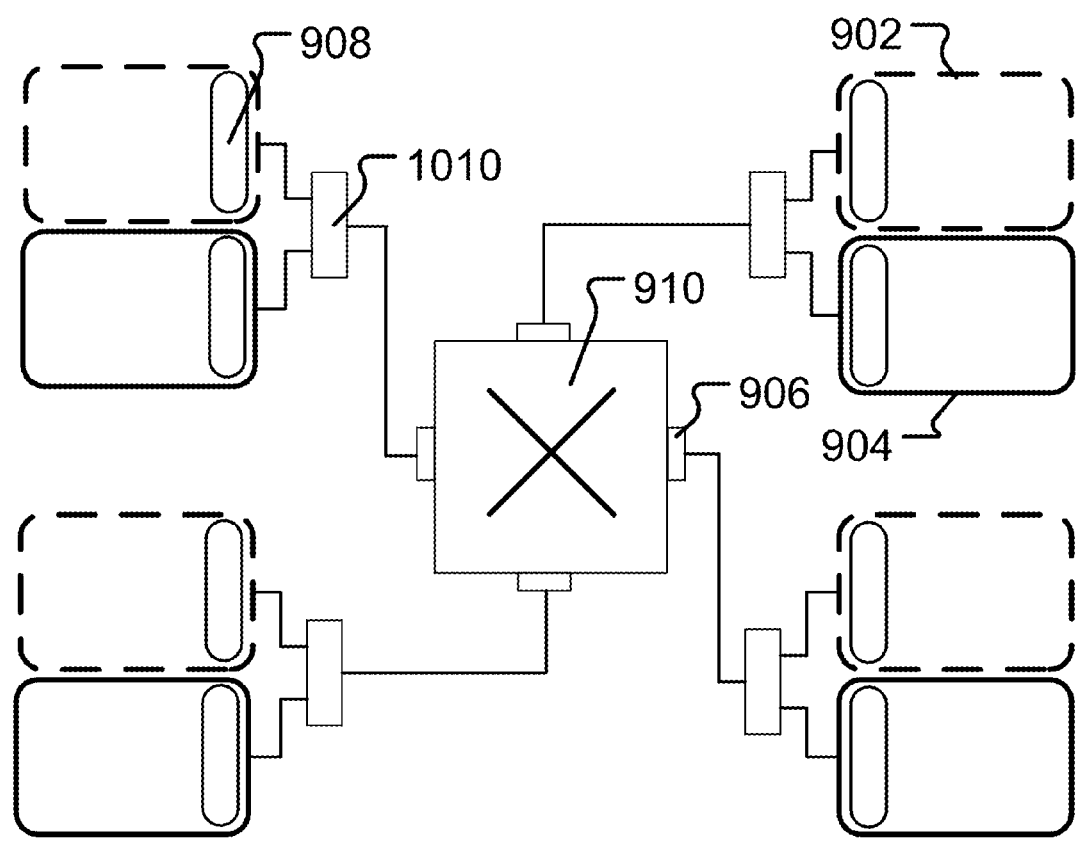
FIG. 10 shows a schematic diagram of an exemplary interconnection network with a control logic module, consistent with embodiments of the present disclosure.

FIG. 10 shows a schematic diagram of a system with an interconnection network 910 with a control logic module 1010, consistent with embodiments of the present disclosure. Aspects of FIG. 10 are directed toward a system 1000 with an interconnection network 910 and a control logic module 1010 for facilitating communication between cores within a 3D IC stack device. Consistent with various embodiments, the interconnection network 910 can be a multi-ported cross bar switch equipped with one or more data ports 906. Each of the data ports 906 can be communicatively connected to a control logic module 1010. The control logic module 1010 can be communicatively connected to a supplementary core 902 and a primary core 904. In certain embodiments, the supplementary core 902 and the primary core 904 can be simultaneously active and arranged in a vertically stacked configuration. Consistent with various embodiments, the control logic module 1010 can facilitate the routing of signals from the supplementary core 902 and the primary core 904. Such a configuration allows for the interconnection network 910 to be constructed with a lesser number of data ports, easing design restrictions. The supplementary core 902 and the primary core 904 can include an I/O interface 908 for transmitting data from one clock domain to another. Consistent with various embodiments, the I/O interface 908 can be a synchronous interface or an asynchronous interface.

Although the present disclosure has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the disclosure.

What is claimed is:

1. An integrated circuit (IC) stack device comprising: a primary IC having a first set of cores with a first ratio of first enabled cores and first disabled cores, a first side on which the first set of cores is located, and a second side opposing the first side; and a supplementary IC interfaced with the primary IC and having a second set of cores with a second ratio of second enabled cores and second disabled cores, the second ratio less than the first ratio, a third side on which the second set of cores is located, and a fourth side opposing the third side; wherein the first side of the primary IC is interfaced with one or both of the third and fourth sides of the supplementary IC; a peripheral component connection located such that the supplementary IC is between the peripheral component connection and the primary IC, the peripheral component connection designed to electrically connect the IC stack device to one or more devices external to the IC stack device; and control logic configured to: route, in a primary mode, signals from a particular enabled core of the first enabled cores to a data bus located within the IC stack device, route, in a secondary mode, signals from a particular enabled core of the second enabled cores to a data bus located within the IC stack device, and route, in a dual mode, signals from both of the particular enabled cores of the first enabled cores and the particular enabled core of the second enabled cores to a data bus located within the IC stack device.

2. The device according to claim 1, wherein the first set of cores and the second set of cores include one or more microprocessors.

3. The device according to claim 1, wherein each core is communicatively connected to a respective clock module, the clock module configured to vary a clock rate of a corresponding core.

4. The device according to claim 1, further comprising a synchronous interface configured to transfer a first clock rate from a first clock domain to a second clock domain, the second clock domain an integer multiple of the first clock domain.

5. The device according to claim 1, further comprising an asynchronous interface configured to transfer a first clock rate from a first clock domain to a second clock domain, the second clock domain asynchronous with the first clock domain.

6. The device according to claim 1, wherein the first side of the primary IC is interfaced with the third side of the supplementary IC.

7. The device according to claim 1, wherein the first side of the primary IC is interfaced with the fourth side of the supplementary IC.

8. The device according to claim 1, wherein the second side of the primary IC is interfaced with the third side of the supplementary IC.

9. The device according to claim 1, wherein the data bus is configured to facilitate communication between the cores on a respective IC.

* * * * *